United States Patent
Boone et al.

(10) Patent No.: US 8,581,108 B1
(45) Date of Patent: Nov. 12, 2013

(54) METHOD FOR PROVIDING NEAR-HERMETICALLY COATED INTEGRATED CIRCUIT ASSEMBLIES

(75) Inventors: Alan P. Boone, Swisher, IA (US); Nathan P. Lower, North Liberty, IA (US); Ross K. Wilcoxon, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 1142 days.

(21) Appl. No.: 11/732,982

(22) Filed: Apr. 5, 2007

Related U.S. Application Data

(63) Continuation-in-part of application No. 11/508,782, filed on Aug. 23, 2006, now Pat. No. 8,076,185.

(51) Int. Cl.
*H05K 1/16* (2006.01)

(52) U.S. Cl.
USPC ............ 174/260; 174/250; 257/446; 257/499

(58) Field of Classification Search
USPC ........ 174/260, 250; 118/715; 361/321.2, 305; 257/466, 499
See application file for complete search history.

(56) References Cited

U.S. PATENT DOCUMENTS

| | | |
|---|---|---|
| 3,508,974 A | 4/1970 | Bressler |
| 3,654,528 A | 4/1972 | Barkan |
| 3,723,790 A | 3/1973 | Dumbaugh et al. |
| 3,812,404 A | 5/1974 | Barkan et al. |
| 4,177,015 A | 12/1979 | Davidson |
| 4,294,658 A | 10/1981 | Humphreys et al. |
| 4,410,874 A | 10/1983 | Scapple et al. |
| 4,505,644 A | 3/1985 | Meisner et al. |
| 4,513,029 A | 4/1985 | Sakai |
| 4,560,084 A | 12/1985 | Wolfson |
| 4,572,924 A | 2/1986 | Wakely et al. |

(Continued)

FOREIGN PATENT DOCUMENTS

| | | |
|---|---|---|
| JP | 55-120083 | 9/1980 |
| JP | 57-027942 | 2/1982 |

(Continued)

OTHER PUBLICATIONS

U.S. Appl. No. 12/286,207, filed Sep. 29, 2008, Lower et al.

(Continued)

*Primary Examiner* — Timothy Thompson
*Assistant Examiner* — Andargie M Aychillhum
(74) *Attorney, Agent, or Firm* — Donna P. Suchy; Daniel M. Barbieri

(57) ABSTRACT

The present invention is a method for providing an integrated circuit assembly, the integrated circuit assembly including an integrated circuit and a substrate. The method includes mounting the integrated circuit to the substrate. The method further includes, during assembly of the integrated circuit assembly, applying a low processing temperature, at least near-hermetic, glass-based coating directly to the integrated circuit and a localized interconnect interface, the interface being configured for connecting the integrated circuit to at least one of the substrate and a second integrated circuit of the assembly. The method further includes curing the coating. Further, the integrated circuit may be a device which is available for at least one of sale, lease and license to a general public, such as a Commercial off the Shelf (COTS) device. Still further, the coating may promote corrosion resistance and reliability of the integrated circuit assembly.

18 Claims, 5 Drawing Sheets

(56) References Cited

U.S. PATENT DOCUMENTS

| | | | |
|---|---|---|---|
| 4,622,433 A | 11/1986 | Frampton | |
| 4,761,518 A | 8/1988 | Butt et al. | |
| 4,765,948 A | 8/1988 | Deluca et al. | |
| 4,773,826 A | 9/1988 | Mole | |
| 4,802,531 A | 2/1989 | Nathenson et al. | |
| 4,882,212 A | 11/1989 | SinghDeo et al. | |
| 4,963,503 A | 10/1990 | Aoki et al. | |
| 5,041,342 A | 8/1991 | Umeda et al. | |
| 5,136,365 A | 8/1992 | Pennisi et al. | |
| 5,140,109 A | 8/1992 | Matsumoto et al. | |
| 5,184,211 A | 2/1993 | Fox | |
| 5,195,231 A | 3/1993 | Fanning et al. | |
| 5,232,970 A | 8/1993 | Solc et al. | |
| 5,244,726 A | 9/1993 | Laney et al. | |
| 5,265,136 A | 11/1993 | Yamazaki et al. | |
| 5,288,769 A | 2/1994 | Papageorge et al. | |
| 5,315,155 A | 5/1994 | O'Donnelly et al. | |
| 5,405,808 A | 4/1995 | Rostoker et al. | |
| 5,502,889 A | 4/1996 | Casson et al. | |
| 5,581,286 A | 12/1996 | Hayes et al. | |
| 5,686,703 A | 11/1997 | Yamaguchi | |
| 5,690,837 A | 11/1997 | Nakaso et al. | |
| 5,702,963 A | 12/1997 | Vu et al. | |
| 5,863,605 A | 1/1999 | Bak-Boychuk et al. | |
| 5,916,944 A * | 6/1999 | Camilletti et al. | 524/394 |
| 5,958,794 A | 9/1999 | Bruxvoort et al. | |
| 5,965,947 A | 10/1999 | Nam et al. | |
| 5,991,351 A | 11/1999 | Woolley | |
| 6,010,956 A | 1/2000 | Takiguchi et al. | |
| 6,019,165 A | 2/2000 | Batchelder | |
| 6,021,844 A | 2/2000 | Batchelder | |
| 6,027,791 A * | 2/2000 | Higashi et al. | 428/209 |
| 6,028,619 A * | 2/2000 | Saita et al. | 347/209 |
| 6,039,896 A | 3/2000 | Miyamoto et al. | |
| 6,048,656 A | 4/2000 | Akram et al. | |
| 6,087,018 A | 7/2000 | Uchiyama | |
| 6,110,656 A | 8/2000 | Eichorst et al. | |
| 6,121,175 A * | 9/2000 | Drescher et al. | 501/59 |
| 6,124,224 A | 9/2000 | Sridharan et al. | |
| 6,159,910 A | 12/2000 | Shimizu et al. | |
| 6,356,334 B1 | 3/2002 | Mathew et al. | |
| 6,370,015 B2 * | 4/2002 | Noda et al. | 361/321.2 |
| 6,423,415 B1 | 7/2002 | Greene et al. | |
| 6,451,283 B1 | 9/2002 | Kuznicki et al. | |
| 6,452,090 B2 | 9/2002 | Takato et al. | |
| 6,486,087 B1 | 11/2002 | Saling et al. | |
| 6,496,359 B2 | 12/2002 | Clark et al. | |
| 6,541,083 B1 | 4/2003 | Landa et al. | |
| 6,586,087 B2 | 7/2003 | Young | |
| 6,599,643 B2 | 7/2003 | Heimann et al. | |
| 6,658,861 B1 | 12/2003 | Ghoshal et al. | |
| 6,665,186 B1 | 12/2003 | Calmidi et al. | |
| 6,708,501 B1 | 3/2004 | Ghoshal et al. | |
| 6,798,072 B2 | 9/2004 | Kajiwara et al. | |
| 6,800,933 B1 | 10/2004 | Uchiyama | |
| 6,918,984 B2 | 7/2005 | Murray et al. | |
| 7,045,905 B2 | 5/2006 | Nakashima | |
| 7,078,263 B2 | 7/2006 | Dean | |
| 7,131,286 B2 | 11/2006 | Ghoshal et al. | |
| 7,176,564 B2 | 2/2007 | Kim | |
| 7,202,598 B2 | 4/2007 | Juestel et al. | |
| 7,293,416 B2 | 11/2007 | Ghoshal | |
| 7,296,417 B2 | 11/2007 | Ghoshal | |
| 7,297,206 B2 | 11/2007 | Naruse et al. | |
| 7,340,904 B2 | 3/2008 | Sauciuc et al. | |
| 7,342,787 B1 | 3/2008 | Bhatia | |
| 7,348,665 B2 | 3/2008 | Sauciuc et al. | |
| 7,391,060 B2 | 6/2008 | Oshio | |
| 7,476,981 B2 | 1/2009 | Bergmann et al. | |
| 7,491,431 B2 | 2/2009 | Chiruvolu et al. | |
| 7,692,259 B2 | 4/2010 | Suehiro | |
| 7,737,356 B2 | 6/2010 | Goldstein | |
| 7,915,527 B1 | 3/2011 | Lower et al. | |
| 7,998,601 B2 | 8/2011 | Mack et al. | |
| 8,017,872 B2 | 9/2011 | Cripe et al. | |
| 8,075,185 B2 | 12/2011 | Hecht et al. | |
| 8,119,040 B2 | 2/2012 | Lower et al. | |
| 2001/0015443 A1 | 8/2001 | Komoto | |
| 2001/0046933 A1 | 11/2001 | Parkhill et al. | |
| 2002/0000630 A1 * | 1/2002 | Coyle | 257/415 |
| 2002/0054976 A1 | 5/2002 | Nakamura et al. | |
| 2002/0076192 A1 | 6/2002 | Bartholomew et al. | |
| 2002/0078856 A1 | 6/2002 | Hahn et al. | |
| 2002/0086115 A1 | 7/2002 | Lamers et al. | |
| 2002/0170173 A1 | 11/2002 | Mashino | |
| 2002/0189495 A1 | 12/2002 | Hayashi et al. | |
| 2002/0189894 A1 | 12/2002 | Davis et al. | |
| 2003/0047735 A1 | 3/2003 | Kyoda et al. | |
| 2003/0080341 A1 | 5/2003 | Sakano et al. | |
| 2003/0218258 A1 | 11/2003 | Charles et al. | |
| 2003/0228424 A1 | 12/2003 | Dove et al. | |
| 2004/0106037 A1 | 6/2004 | Cho et al. | |
| 2004/0116577 A1 | 6/2004 | Naruse et al. | |
| 2004/0156995 A1 | 8/2004 | Komiyama et al. | |
| 2004/0194667 A1 | 10/2004 | Reuscher | |
| 2005/0003947 A1 | 1/2005 | Mazany et al. | |
| 2005/0082691 A1 | 4/2005 | Ito et al. | |
| 2005/0099775 A1 | 5/2005 | Pokharna et al. | |
| 2005/0116237 A1 | 6/2005 | Voutsas | |
| 2005/0123684 A1 | 6/2005 | Makowski et al. | |
| 2005/0179742 A1 | 8/2005 | Keenan et al. | |
| 2006/0045755 A1 | 3/2006 | McDonald et al. | |
| 2006/0068218 A1 | 3/2006 | Hooghan et al. | |
| 2006/0095677 A1 | 5/2006 | Hakura et al. | |
| 2006/0113066 A1 | 6/2006 | Mongia et al. | |
| 2006/0135342 A1 | 6/2006 | Anderson et al. | |
| 2006/0158849 A1 | 7/2006 | Martin et al. | |
| 2006/0250731 A1 | 11/2006 | Parkhurst et al. | |
| 2006/0268525 A1 | 11/2006 | Jeong | |
| 2006/0283546 A1 | 12/2006 | Tremel et al. | |
| 2007/0075323 A1 | 4/2007 | Kanazawa et al. | |
| 2007/0102833 A1 | 5/2007 | Hack et al. | |
| 2007/0108586 A1 | 5/2007 | Uematsu et al. | |
| 2007/0224400 A1 | 9/2007 | Meguro et al. | |
| 2008/0006204 A1 * | 1/2008 | Rusinko et al. | 118/715 |
| 2008/0050512 A1 | 2/2008 | Lower et al. | |
| 2008/0063875 A1 | 3/2008 | Robinson et al. | |
| 2008/0142966 A1 | 6/2008 | Hirano et al. | |
| 2008/0299300 A1 | 12/2008 | Wilcoxon et al. | |
| 2009/0183774 A1 | 7/2009 | Atanackovic | |
| 2009/0246355 A9 | 10/2009 | Lower et al. | |
| 2010/0064518 A1 | 3/2010 | Lower et al. | |
| 2010/0064695 A1 | 3/2010 | Wilcoxon et al. | |
| 2010/0065256 A1 | 3/2010 | Wilcoxon et al. | |
| 2010/0066178 A1 | 3/2010 | Lower et al. | |
| 2012/0118623 A1 | 5/2012 | Lower et al. | |

FOREIGN PATENT DOCUMENTS

| | | |
|---|---|---|
| JP | 57027942 A | 2/1982 |
| JP | 60-013875 | 1/1985 |
| JP | 02-064071 | 3/1990 |
| JP | 11-095246 | 4/1999 |
| JP | 2003-332505 A | 11/2003 |
| JP | 2006-045420 | 2/2006 |
| WO | WO 2006/095677 | 9/2006 |
| WO | WO 2006/095677 A1 | 9/2006 |
| WO | PCT/US2008/074224 | 8/2008 |
| WO | PCT/US2008/075591 | 9/2008 |
| WO | PCTUS2009/031699 | 1/2009 |

OTHER PUBLICATIONS

U.S. Appl. No. 12/240,775, filed Sep. 29, 2008, Lower et al.
U.S. Appl. No. 11/959,225, filed Dec. 18, 2007, Lower et al.
U.S. Appl. No. 11/784,932, filed Apr. 10, 2007, Lower et al.
U.S. Appl. No. 11/732,981, filed Apr. 5, 2007, Wilcoxon et al.
U.S. Appl. No. 11/784,158, filed Apr. 5, 2007, Lower et al.
Click, et al., "Schott Low Temperature Bonding for Precision Optics," can be found at website: http://optics.nasa.gov/tech_days/tech_days_2004/docs/18%20Aug%202004/23%20Schott%20Low%20Temperature%20Bonding.pdf, p. 20.
Lewis, J. A., et al., Materialstoday: Jul./Aug. 2004, Direct Writing in three dimension, ISSN: 1369 7021 © Elsevier Ltd 2004, pp. 32-39.

(56) References Cited

OTHER PUBLICATIONS

Optomec® Systems M3D® Breakthrough Technology for Printable Electronics, pp. 1-2.
International Search Report and Written Opinion for Application No. PCT/US2009/036355, mail date Jun. 30, 2009, 11 pages.
International Search Report and Written Opinion for Application No. PCT/US2009/031699, mail date Aug. 18, 2009, 16 pages.
Office Action for U.S. Appl. No. 11/959,225, mail date Dec. 2, 2009, 15 pages.
International Search Report and Written Opinion for International Application No. PCT/US2008/075591, mail date Apr. 8, 2009, 7 pages.
Non-Final Office Action for U.S. Appl. No. 11/784,932, dated Apr. 3, 2009, 8 pages.
Non-Final Office Action for U.S. Appl. No. 11/784,158, dated Apr. 21, 2009, 10 pages.
Office Action for U.S. Appl. No. 12/116,126, mail date Apr. 22, 2010, 7 pages.
Office Action for U.S. Appl. No. 11/959,225, mail date May 26, 2010, 17 pages.
Office Action for U.S. Appl. No. 11/784,158, mail date Jun. 17, 2010, 7 pages.
Office Action for U.S. Appl. No. 12/116,126, mail date Nov. 20, 2009, 7 pages.
Office Action for U.S. Appl. No. 11/784,932, mail date Feb. 16, 2010, 11 pages.
Office Action for U.S. Appl. No. 11/508,782, mail date Feb. 24, 2010, 12 pages.
Office Action for U.S. Appl. No. 11/784,158, mail date Oct. 8, 2009, 7 pages.
Office Action for U.S. Appl. No. 11/784,158, mail date Mar. 26, 2010, 7 pages.
Final Office Action for U.S. Appl. No. 11/508,782, dated Jun. 16, 2009, 13 pages.
U.S. Appl. No. 11/508,782, Nathan P. Lower, et al.
U.S. Appl. No. 12/116,126, Nathan P. Lower, et al.
Golubev, K.S., et al., Modeling of Acid-Base Properties of Binary Alkali-Silicate Melts, Rev. Adv. Mater. Sci. 6, (2004), pp. 33-40, website: http://www.ipme.ru/e-journals/RAMS/no_1604/golubev/golubev.pdf.
Kennedy, C. R., Strength and Fracture Toughness of Binary Alkali Silicate Glasses (Abstract only), Feb. 14, 1974, website: http://oai.dtic.mil/oai/oai?verb=getRecord&metadataPrefix=html&identifier=ADA016820, 1 page.
Amendment and Reply for U.S. Appl. No. 11/959,225, mail date Jan. 27, 2011, 9 pages.
Amendment and Reply for U.S. Appl. No. 11/959,225, mail date Jun. 13, 2011, 12 pages.
Advisory Action for U.S. Appl. No. 11/959,225, mail date Jul. 5, 2011, 3 pages.
Office Action for U.S. Appl. No. 11/959,225, mail date Nov. 18, 2011, 16 pages.
Amendment and Reply for U.S. Appl. No. 11/508,782, mail date Sep. 2, 2008, 7 pages.
Amendment and Reply for U.S. Appl. No. 11/508,782, mail date Mar. 24, 2009, 10 pages.
Amendment and Reply for U.S. Appl. No. 11/508,782, mail date Aug. 14, 2009, 12 pages.
Amendment and Reply for U.S. Appl. No. 11/508,782, mail date Jun. 24, 2010, 10 pages.
Amendment and Reply for U.S. Appl. 11/508,782, mail date Nov. 2, 2010, 12 pages.
Supplemental Amendment and Reply for U.S. Appl. No. 11/508,782, mail date Nov. 3, 2010, 3 pages.
Request for Continued Examination for U.S. Appl. No. 11/508,782, mail date Dec. 2, 2010, 10 pages.
Amendment and Reply for U.S. Appl. No. 11/508,782, mail date Apr. 5, 2011, 9 pages.
Request for Continued Examination for U.S. Appl. No. 11/508,782, mail date Aug. 30, 2011, 6 pages.
Notice of Allowance for U.S. Appl. No. 11/508,782, mail date Sep. 20, 2011, 7 pages.
Amendment and Reply for U.S. Appl. No. 12/116,126, mail date Aug. 10, 2011, 11 pages.
Office Action for U.S. Appl. No. 12/116,126, mail date Sep. 12, 2011, 11 pages.
Amendment and Reply for U.S. Appl. No. 12/116,126, mail date Dec. 12, 2011, 10 pages.
Notice of Allowance for U.S. Appl. No. 12/116,126, mail date Jan. 5, 2012, 10 pages.
Amendment and Reply for U.S. Appl. No. 12/240,775, mail date Sep. 26, 2011, 11 pages.
Request for Continued Examination for U.S. Appl. No. 11/732,981, mail date May 16, 2011, 12 pages.
Terminal Disclaimer for U.S. Appl. No. 11/732,981, mail date May 16, 2011, 1 page.
Notice of Allowance for U.S. Appl. No. 11/732,981, mail date Dec. 29, 2011, 7 pages.
Request for Continued Examination for U.S. Appl. No. 11/784,932, mail date Aug. 10, 2011, 6 pages.
Notice of Allowance for U.S. Appl. No. 11/784,932, mail date Aug. 23, 2011, 8 pages.
Notice of Allowance for U.S. Appl. No. 12/286,207, mail date Oct. 6, 2011, 8 pages.
Terminal Disclaimer for U.S. Appl. No. 11/784,158, mail date May 26, 2010, 1 page.
International Search Report and Written Opinion for International Application No. PCT/US2008/074224, mail date Jan. 30, 2009, 10 pages.
Office Action for U.S. Appl. No. 12/284,670, mail date Sep. 28, 2010, 11 pages.
Office Action for U.S. Appl. No. 12/116,126, mail date Oct. 25, 2010, 9 pages.
Office Action for U.S. Appl. No. 12/286,207, mail date Dec. 27, 2010, 15 pages.
Office Action for U.S. Appl. No. 11/508,782, mail date Jan. 19, 2011, 10 pages.
Office Action for U.S. Appl. No. 12/284,670, mail date Feb. 17, 2011, 13 pages.
Office Action for U.S. Appl. No. 12/116,126, mail date Feb. 25, 2011, 9 pages.
Office Action for U.S. Appl. No. 11/732,981, mail date Mar. 16, 2011, 7 pages.
Office Action for U.S. Appl. No. 11/959,225, mail date Apr. 13, 2011, 17 pages.
Response for U.S. Appl. No. 11/784,158, mail date Jan. 8, 2010, 10 pages.
Amendment and Reply for U.S. Appl. No. 11/784,158, mail date May 26, 2010, 12 pages.
Response for U.S. Appl. No. 11/784,932, mail date Jul. 2, 2009, 8 pages.
Notice of Allowance for U.S. Appl. No. 11/784,932, mail date May 12, 2011, 11 pages.
Office Action for U.S. Appl. No. 11/508,782, mail date Dec. 24, 2008, 9 pages.
Response for U.S. Appl. No. 11/508,782, mail date Nov. 13, 2009, 14 pages.
Notice of Allowance for U.S. Appl. No. 11/508,782, mail date May 31, 2011, 9 pages.
Supplemental Notice of Allowability for U.S. Appl. No. 11/508,782, mail date Jul. 26, 2011, 4 pages.
Notice of Allowance for U.S. Appl. No. 11/732,981, mail date Jul. 26, 2011, 7 pages.
Notice of Allowance for U.S. Appl. No. 12/284,670, mail date May 11, 2011, 7 pages.
Notice of Allowance for U.S. Appl. No. 12/286,207, mail date Jun. 27, 2011, 12 pages.
Office Action for U.S. Appl. No. 11/959,225, mail date Jul. 22, 2009, 10 pages.
Response for U.S. Appl. No. 11/959,225, mail date Mar. 2, 2010, 9 pages.
Response for U.S. Appl. No. 12/116,126, mail date Feb. 22, 2010, 10 pages.

(56) References Cited

OTHER PUBLICATIONS

Office Action for U.S. Appl. No. 12/116,126, mail date May 10, 2011, 8 pages.
Office Action for U.S. Appl. No. 12/240,775, mail date May 26, 2011, 9 pages.
Office Action for U.S. Appl. No. 11/959,225, mail date Apr. 23, 2013, 6 pages.
Advisory Action for U.S. Appl. No. 11/508,782, mail date Aug. 31, 2009, 3 pages.
Advisory Action for U.S. Appl. No. 11/959,225, mail date Jul. 31, 2012, 3 pages.
Advisory Action for U.S. Appl. No. 12/116,126, mail date Jun. 29, 2010, 4 pages.
Advisory Action for U.S. Appl. No. 12/240,775, mail date Nov. 14, 2012, 2 pages.
Amendment and Reply for U.S. Appl. No. 12/116,126, mail date Jul. 22, 2010, 9 pages.
Amendment and Reply for U.S. Appl. No. 11/732,981, mail date Jan. 6, 2011, 9 pages.
Amendment and Reply for U.S. Appl. No. 11/732,982, mail date Sep. 28, 2012, 7 pages.
Amendment and Reply for U.S. Appl. No. 11/784,158, mail date Jul. 21, 2009, 10 pages.
Amendment and Reply for U.S. Appl. No. 11/784,932, mail date Jun. 14, 2010, 9 pages.
Amendment and Reply for U.S. Appl. No. 11/959,225, mail date Aug. 24, 2009, 2 pages.
Amendment and Reply for U.S. Appl. No. 11/959,225, mail date Aug. 26, 2010, 11 pages.
Amendment and Reply for U.S. Appl. No. 11/959,225, mail date Feb. 15, 2012, 15 pages.
Amendment and Reply for U.S. Appl. No. 11/959,225, mail date Jul. 5, 2011, 6 pages.
Amendment and Reply for U.S. Appl. No. 11/959,225, mail date Jun. 25, 2012, 14 pages.
Amendment and Reply for U.S. Appl. No. 12/116,126, mail date Apr. 29, 2011, 9 pages.
Amendment and Reply for U.S. Appl. No. 12/116,126, mail date Jan. 25, 2011, 8 pages.
Amendment and Reply for U.S. Appl. No. 12/116,126, mail date Jun. 22, 2010, 7 pages.
Amendment and Reply for U.S. Appl. No. 12/240,775, mail date Jul. 2, 2012, 12 pages.
Amendment and Reply for U.S. Appl. No. 12/240,775, mail date Nov. 6, 2012, 8 pages.
Amendment and Reply for U.S. Appl. No. 12/284,670, mail date Apr. 18, 2011, 9 pages.
Amendment and Reply for U.S. Appl. No. 12/286,207, mail date Mar. 28, 2011, 12 pages.
Amendment and Reply for U.S. Appl. No. 12/493,022, mail date Aug. 28, 2012, 7 pages.
Amendment and Reply for U.S. Appl. No. 12/493,022, mail date Mar. 23, 2012, 3 pages.
Amendment and Reply for U.S. Appl. No. 13/359,105, mail date Aug. 8, 2012, 10 pages.
Examiner Interview Summary for U.S. Appl. No. 11/508,782, mail date Jan. 5, 2011, 2 pages.
Notice of Allowance for U.S. Appl. No. 12/493,022, mail date Sep. 20, 2012, 5 pages.
Office Action for U.S. Appl. No. 11/959,225, mail date Apr. 25, 2012, 17 pages.
Office Action for U.S. Appl. No. 11/959,225, mail date Sep. 25, 2012, 16 pages.
Office Action for U.S. Appl. No. 12/240,775, mail date Apr. 2, 2012, 8 pages.
Office Action for U.S. Appl. No. 12/240,775, mail date Sep. 6, 2012, 9 pages.
Office Action for U.S. Appl. No. 12/493,022, mail date May 30, 2012, 13 pages.
Office Action for U.S. Appl. No. 13/359,105, mail date Jan. 17, 2013, 7 pages.
Office Action for U.S. Appl. No. 13/359,105, mail date May 8, 2012, 12 pages.
Office Action for U.S. Appl. No. 13/359,105, mail date Oct. 19, 2012, 7 pages.
Request for Continued Examination for U.S. Appl. No. 11/784,932, mail date Jun. 14, 2010, 4 pages.
Request for Continued Examination for U.S. Appl. No. 11/959,225, mail date Aug. 27, 2012, 19 pages.
Request for Continued Examination for U.S. Appl. No. 12/116,126, mail date Apr. 29, 2011, 4 pages.
Request for Continued Examination for U.S. Appl. No. 12/116,126, mail date Jul. 22, 2010, 4 pages.
Request for Continued Examination for U.S. Appl. No. 12/286,207, mail date Sep. 26, 2011, 4 pages.
Restriction Requirement for U.S. Appl. No. 12/493,022, mail date Feb. 22, 2012, 6 pages.
Restriction Requirement for U.S. Appl. No. 13/329,068, mail date Jan. 15, 2013, 5 pages.
Technical Standard Order, TSO-C115b, Airborne Area Navigation Equipment Using Multi-Sensor Inputs, Department of Transportation, Federal Aviation Administration, Sep. 30, 1994, 11 pages.
Techpowerup, "NanoCoolers puts liquid metal in your PC," website: http://www.techpowerup.com/?3105, May 4, 2005, 19 pages.
Click, et al., "Schott Low Temperature Bonding for Precision Optics," can be found at website: http://optics.nasa.gov/tech_days/tech_days_2004/docs/18%20Aug%202004/23%20Schott%20Low%20Temperature%20Bonding.pdf, p. 20.
Lewis, J. A., et al., Materialstoday: Jul./Aug. 2004, Direct Writing in three dimension, ISSN: 1369 7021© Elsevier Ltd 2004, pp. 32-39.
PQ Corporation, "Bonding and Coating Applications of PQ® Soluble Silicates," Bulletin 12-31, (2003) p. 7.
PQ Corporation, PQ® Soluble Silicates in Refractory and Chemical-Resistant Cements, Bulletin 24-1, (2003), p. 6.
Thresh, John C., "The Action of Natural Waters on Lead," The Analyst, vol. XLVII, No. 560, (Nov. 1922) pp. 459-468.
Nascimento, M. L. F., et al. Universal curve of ionic conductivities in binary alkali silicate glasses, Journal of Materials Science (2005), Springer Science + Business Media, Inc., website: http://www.springerlink.com/content/p7535075x1872016/, 3 pgs.
Pedone, A., et al. Insight into Elastic Properties of Binary Alkali Silicate Glasses; Prediction and Interpretation through Atomistic Simulation Techniques, Chemistry of Materials, 2007, vol. 19, No. 13, pp. 3144-3154, American Chemical Society (Abstract only) website: http://pubs.acs.org/doi/abs/10.1021/cm062619r, 2 pgs.
Shermer, H. F., Thermal expansion of binary alkali silicate glasses, Journal of Research of the National Bureau of Standards, vol. 57, No. 2, Aug. 1956, Research Paper No. 2698, website: http://nvl.nist.gov/pub/nistpubs/jres/057/2/V57.N02.A05.pdf, 5 pgs.
The Mixed—Alkali Effect for the Viscosity of Glasses, printed on Dec. 3, 2010 from website: http://glassproperties.com/viscosity/mixed-alkali-effect-viscosity/, 7 pages.
The Structure of Glasses. Alkali silicate glasses, printed on Dec. 3, 2010 from website: http://www.ptc.tugraz.at/specmag/struct/ss.htm, 1 page.
Office Action for U.S. Application No. 11/508,782 (F&L Ref.: 047141-0580), mail date Sep. 2, 2010, 14 pp.
Office Action for U.S. Appl. No. 11/732,981, mail date Oct. 6, 2010, 10 pages.
Office Action for U.S. Appl. No. 11/959,225, mail date Oct. 27, 2010, 12 pages.
Office Action for U.S. Appl. No. 11/784,932, mail date Nov. 10, 2010, 10 pages.
Notice of Allowance for U.S. Appl. No. 11/784,158, mail date Nov. 29, 2010, 8 pages.
Office Action for U.S. Appl. No. 13/287,734, mail date Apr. 11, 2013, 18 pages.

* cited by examiner

METHOD FOR PROVIDING NEAR-HERMETICALLY COATED INTEGRATED CIRCUIT ASSEMBLIES

CROSS-REFERENCE TO RELATED APPLICATIONS

The present application is a continuation-in-part application and claims priority under 35 U.S.C. §120 to the U.S. patent application Ser. No. 11/508,782 entitled: Integrated Circuit Protection and Ruggedization Coatings and Methods filed Aug. 23, 2006 now U.S. Pat. No. 8,076,185, which is herein incorporated by reference in its entirety.

FIELD OF THE INVENTION

The present invention relates to the field of packaging and interconnection of integrated circuit assemblies and particularly to a method for providing near-hermetically coated integrated circuit assemblies.

BACKGROUND OF THE INVENTION

Integrated circuit packages are produced for usage in a variety of products or for a variety of applications. For example, integrated circuit packages which are designed for use in military and avionics applications are often required to survive and/or operate under aggressive or rigorous operating conditions and environments. These integrated circuit packages (ex—hermetic packages) are often expected to have a long lifespan (i.e., remain functionally operable over a long period of time), such as for 20 years or more, and are typically very costly to produce.

Contrastingly, most currently available integrated circuit packages are designed for usage in products which present relatively benign/much less rigorous operating conditions, such as desktop PC's, electronic games and cell phones. Such integrated circuit packages are commonly referred to as Commercial off the Shelf (COTS) devices. These COTS devices tend to have a relatively short lifespan (ex—2 to 5 years) and are relatively inexpensive to produce compared to military electronics components.

In recent years the military electronics industry has sought a less expensive alternative to the high cost integrated circuit packages discussed above, which are currently implemented in environmentally severe military and avionics applications. One alternative has been to implement the currently available (and less expensive) COTS devices, in the more demanding military and avionics environments. However, when the currently available COTS devices have been subjected to these more rigorous conditions, they have been especially prone to failure due to higher operating temperatures, corrosion, or the like. Current methods of modifying or designing integrated circuit packages for improved corrosion resistance are typically very expensive and may exacerbate other failure mechanisms and thereby reduce reliability.

Thus, it would be desirable to have a method for providing near-hermetically coated integrated circuit assemblies which address the problems associated with current solutions.

SUMMARY OF THE INVENTION

Accordingly, an embodiment of the present invention is directed to a method for providing an integrated circuit assembly, the integrated circuit assembly including an integrated circuit and a substrate, the method including: mounting the integrated circuit to the substrate; during assembly of the integrated circuit assembly, applying a low processing temperature, at least near-hermetic, glass-based coating directly to the integrated circuit and a localized interconnect interface, the interface being configured for connecting the integrated circuit to at least one of the substrate and a second integrated circuit of the assembly; and curing the coating.

A further embodiment of the present invention is directed to a method for providing an electronic device, the electronic device including an integrated circuit assembly, the integrated circuit assembly including an integrated circuit and a substrate, the method including: mounting the integrated circuit to the substrate; during assembly of the integrated circuit assembly, applying a low processing temperature, at least near-hermetic, glass-based coating directly to the integrated circuit and a localized interconnect interface, the interface being configured for connecting the integrated circuit to at least one of the substrate and a second integrated circuit of the assembly; curing the coating; and at least substantially enclosing the integrated circuit assembly within a housing.

A still further embodiment of the present invention is directed to an integrated circuit assembly, including: a substrate; and an integrated circuit configured for being mounted to the substrate via a localized interconnect interface, the interface being configured for connecting the integrated circuit to at least one of the substrate and a second integrated circuit of the assembly, wherein the integrated circuit and the localized interconnect interface are at least partially coated with a low processing temperature, at least near-hermetic, glass-based coating for promoting reliability of the integrated circuit assembly in at least one of high temperature operating environments and corrosive operating environments.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
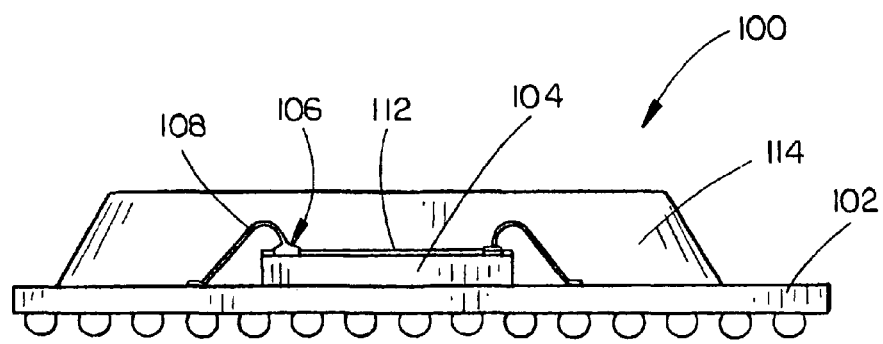
FIG. 1 is a view of an integrated circuit assembly in accordance with an exemplary embodiment of the present invention.

FIG. 1 illustrates a view of an integrated circuit assembly in accordance with an exemplary embodiment of the present invention. In a present embodiment, the integrated circuit assembly 100 includes a substrate 102. For example, the substrate 102 may be (or may be part of) a chip carrier, such as a Ball Grid Array, a Chip Scale Package substrate, a package substrate, a device substrate, a Ceramic Pin Grid Array (CPGA), a Dual in-line package, an Organic Pin Grid Array (OPGA), a Flip-chip Pin Grid Array, a Pin Grid Array, a Multi-chip Module (MCM), or the like, and may be configured for at least partially encapsulating and protecting an integrated circuit 104. For example, the substrate 102 may form a recessed area which is at least partially guarded by an at least partial enclosure 114 configured for at least partially encapsulating an integrated circuit (ex.—die, chip) and protecting the integrated circuit 104. Further, the substrate 102 may be formed of a ceramic material, a plastic material, an epoxy material or the like for promoting the prevention of physical damage and/or corrosion of the integrated circuit 104. In further embodiments, the substrate 102 may be a printed circuit board. For instance, the printed circuit board may be a motherboard, an expansion board, a card, a daughtercard, a controller board, a network interface card (NIC), a video adapter, or the like.

In current embodiments, the integrated circuit assembly 100 includes the integrated circuit 104. For instance, the integrated circuit 104 (IC) may be a microcircuit, a chip, a microchip, a silicon chip, a computer chip, a monolithic integrated circuit, a hybrid integrated circuit, or the like.

The integrated circuit 104 of the present invention is configured for being mounted to the substrate 102 via a localized interconnect interface 106, the interface being configured for connecting (ex—electrically connecting) the integrated circuit to the substrate. For example, the integrated circuit 104 may be wire bonded (such as by ball bonding, wedge bonding, or the like) to the substrate 102, with the localized interconnect interface 106 being a bond wire-bond pad interface. Further, the bond wire-bond pad interface may include one or more bond wires 108 and/or bond pads 110. For instance, a bond wire included in the one or more bond wires 108 may be a gold, copper, or aluminum wire. Further, a first end of the bond wire 108 may be configured for attachment to an inner lead of the substrate 102, while a second end of the bond wire 108 may be configured for attachment to a bond pad 110 of the integrated circuit 104. For example, one or more of heat, pressure and ultrasonic energy may be utilized in attaching the ends of the wire 108 to the substrate 102 and integrated circuit 104 respectively for electrically connecting to and/or securing the integrated circuit 104 onto the substrate.

Figure 4A:
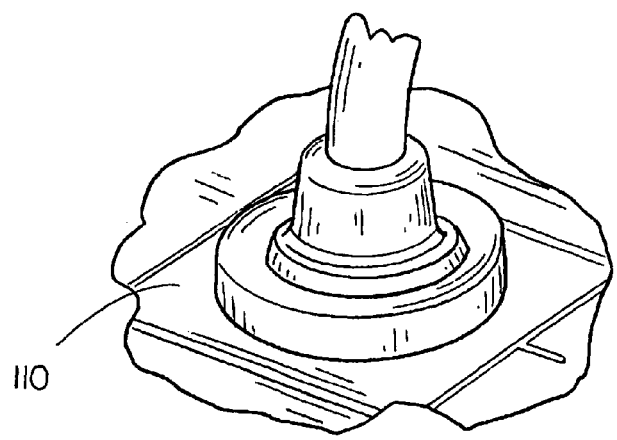
FIGS. 4A and 4B are close-up views of an uncoated localized interconnect interface and a coated localized interconnect interface respectively, in accordance with an exemplary embodiment of the present invention.
Figure 4B:
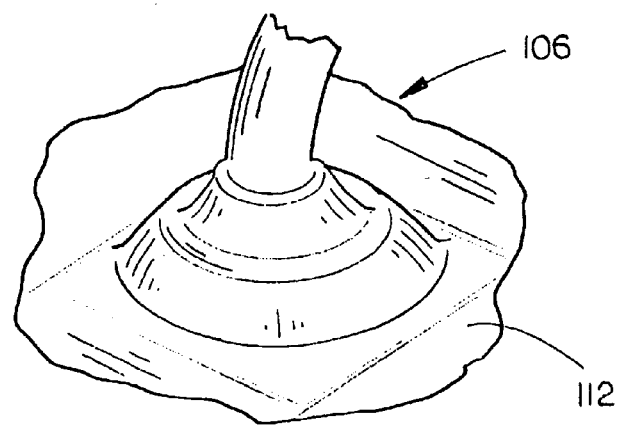

In an exemplary embodiment, the integrated circuit 104 and the localized interconnect interface 106 of the integrated circuit assembly 100 (shown prior to being coated/without coating in FIG. 4A) may be at least partially coated with a coating 112. (as shown in FIG. 4B in accordance with configurations of the present invention). For example, as shown in FIG. 4B, the coating may be applied at/over an attachment point between the bond wire 108 and the bond pad 110 of the integrated circuit 104. For instance, the coating 112 may be applied over a surface of a ball bond formed when the bond wire 108 is attached to the bond pad 110, thereby covering the ball bond, at least part of the bond wire 108 and the bond pad 110 of the integrated circuit 104. Corrosion at an interface between the ball bond 106 and/or the bond pad 110 is a primary point of failure for a number of integrated circuit assemblies in harsh environments. In further embodiments, the localized interconnect interface may be any areas, surfaces, etc. of the integrated circuit (ex—die attach) and the substrate 102 which may contact one another. In additional embodiments, the localized interconnect interface may be an attachment point between the bond wire 108 and the substrate 102 wherein the coating may also be applied. Further, the localized interconnect interface may be configured for connecting the integrated circuit 104 to a second integrated circuit of the assembly 100. For example, the localized interconnect interface may be configured for connecting the bond pad 108 on the integrated circuit 104 to a bond pad located on the second integrated circuit. Alternatively, the localized interconnect interface may be configured for connecting the bond pad 110 of the integrated circuit 104 to a second bond pad on the same integrated circuit 104. In further embodiments, the localized interconnect interface may be a point (ex—area, surface, etc.) of attachment between a flip-chip bonded integrated circuit (ex—chip) and its corresponding substrate. In alternative embodiments, the integrated circuit 104 may be connected directly to a printed circuit board, with the coating being applied at an attachment point between the integrated circuit 104 and the printed circuit board.

In a current embodiment, the coating 112 may be a hermetic (ex—airtight) or near-hermetic coating for promoting reliability of the integrated circuit assembly 100 in high temperature operating environments and/or corrosive operating environments, such as military or avionics environments. In further embodiments, the coating 112 may be a low processing temperature coating. For instance, the coating 112 may be formulated for being applied and/or cured at a temperature less than or equal to 160 degrees Celsius. In additional embodiments, the coating 112 may be a glass-based Coating. For example, the coating may be an alkali silicate-based coating. Still further, the coating may be a variety of formulations, such as any one or more of the formulations described in U.S. patent application Ser. No. 11/508,782 entitled: Integrated Circuit Protection and Ruggedization Coatings and Methods filed Aug. 23, 2006, (pending) which is herein incorporated by reference in its entirety.

In a present embodiment, the integrated circuit 104 may be a device which is available for at least one of sale, lease and license to a general public. For instance, the integrated circuit 104 may be a Commercial off the Shelf (COTS) device.

Figure 2:
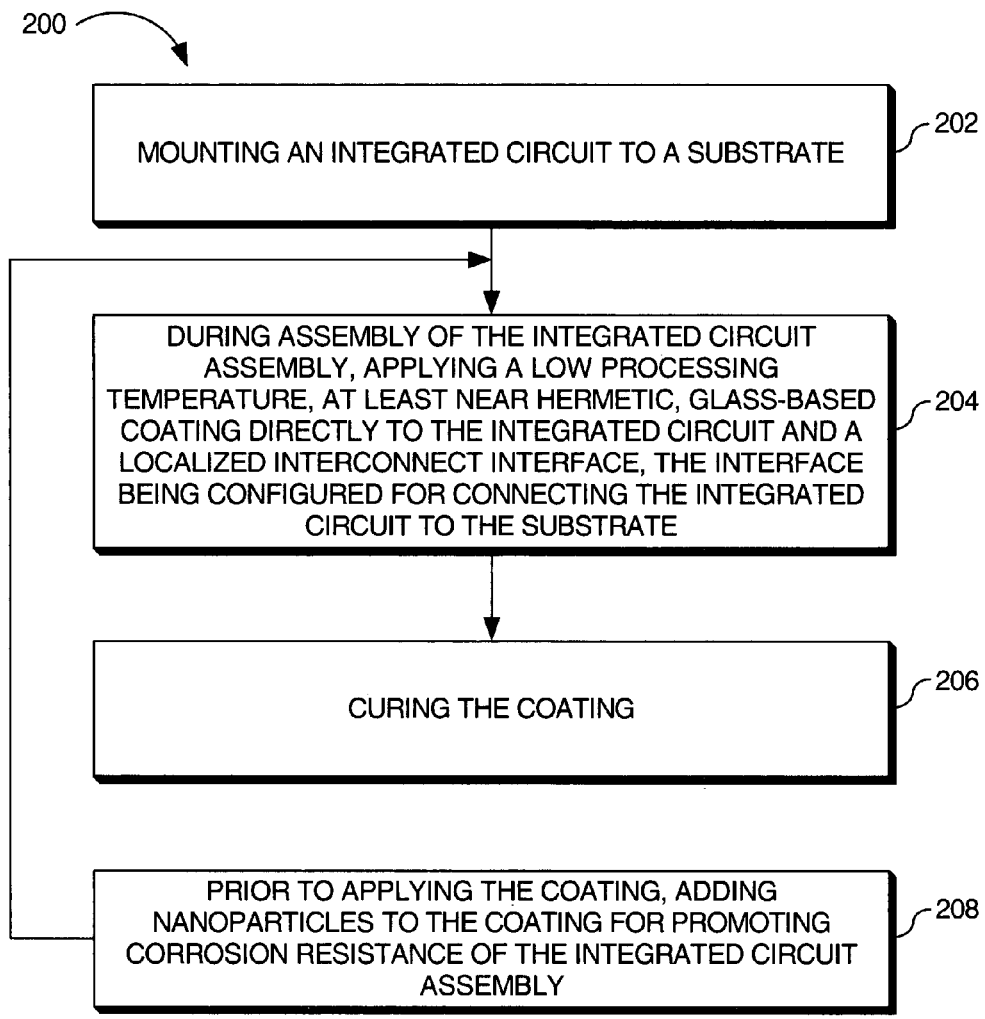
FIG. 2 is a flowchart illustrating a method for providing an integrated circuit assembly in accordance with an exemplary embodiment of the present invention.

FIG. 2 illustrates a method for providing an integrated circuit assembly, the integrated circuit assembly including an integrated circuit and a substrate in accordance with an exemplary embodiment of the present invention. In a present embodiment, the method 200 includes mounting the integrated circuit to the substrate 202. In further embodiments, the method 200 further includes, during assembly of the integrated circuit assembly, applying a low processing temperature, at least near-hermetic, glass-based coating directly to the integrated circuit and a localized interconnect interface for the integrated circuit and the substrate 204. For instance, the localized interconnect interface may be a bond wire-bond pad interface as discussed above. Further, the glass-based coating may be an alkali silicate-based coating. In additional embodiments, the method 200 further includes curing the coating 206. In exemplary embodiments, the steps of applying the coating 204 and curing the coating 206 may be performed at a temperature less than or equal to 160 degrees Celsius. In still further embodiments, applying the coating 204 may include applying the coating in one or more layers, which may promote prevention of cracking of the coating during curing. In additional embodiments, the coating may be maintained/stored and/or applied at atmospheric pressure.

In a present embodiment, the method 200 further includes, prior to applying the coating, adding nanoparticles/nano-sized particles (ex—particles having at least one dimension less than 100 nm) to the coating for promoting corrosion resistance of the assembly 208 and/or the coating itself. For example, nano-sized particles of calcium carbonate, zinc oxide, divalent metal cations, rare earth oxides and/or the like may be added to the coating for promoting corrosion resistance of the integrated circuit assembly.

Figure 3:
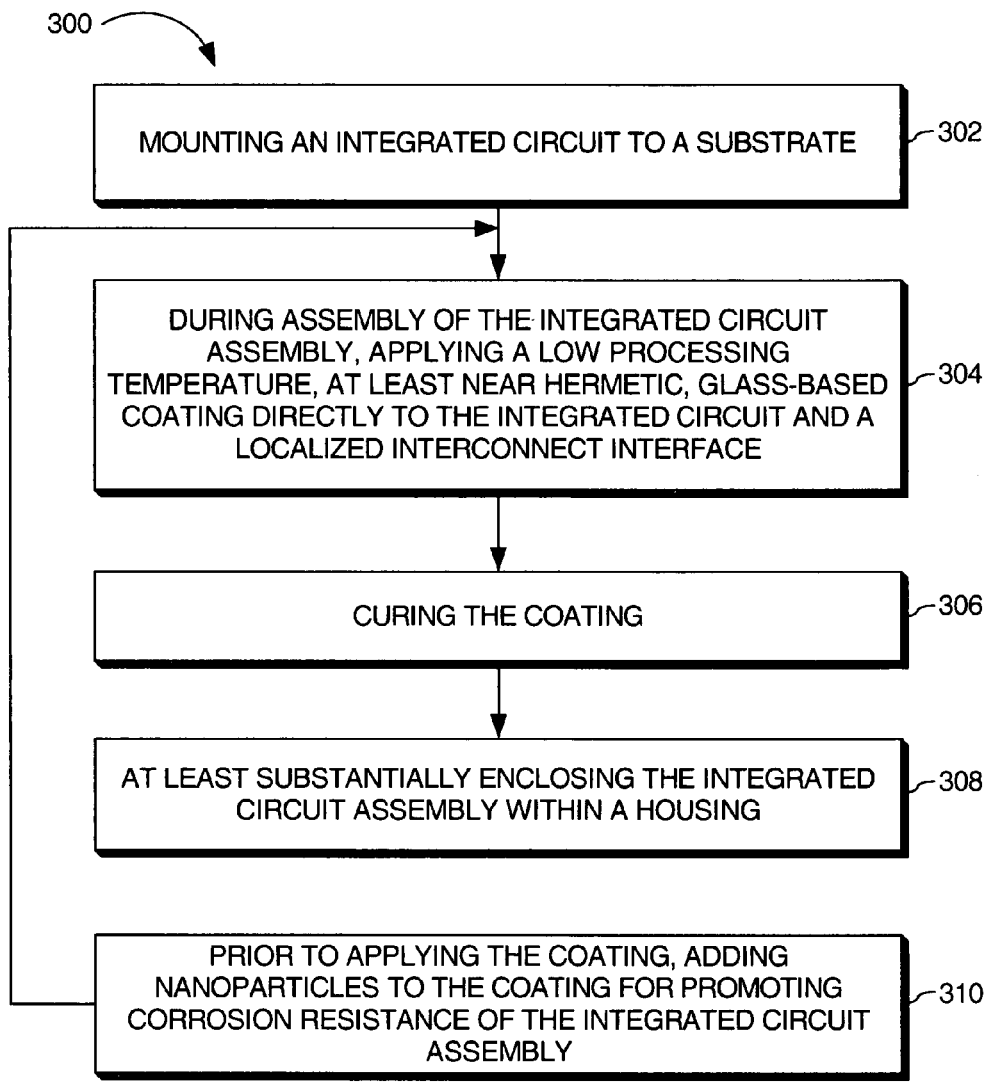
FIG. 3 is a flowchart illustrating a method for providing an electronic device in accordance with an exemplary embodiment of the present invention.

FIG. 3 illustrates a method for providing an electronic device, the electronic device including an integrated circuit assembly, the integrated circuit assembly including an integrated circuit and a substrate in accordance with an exemplary embodiment of the present invention. For instance, the electronic device may be a computer, a cellular phone, or various other devices which may implement the integrated circuit assembly. In a present embodiment, the method 300 includes mounting the integrated circuit to the substrate 302. In exemplary embodiments, the method 300 further includes, during assembly of the integrated circuit assembly, applying a low processing temperature, at least near-hermetic, glass-based coating directly to the integrated circuit and a localized interconnect interface for the integrated circuit and the substrate 304. For instance, the localized interconnect interface may be a bond wire-bond pad interface as discussed above. Further, the glass-based coating may be an alkali silicate-based coating. In further embodiments, the method 300 further includes curing the coating 306. In exemplary embodiments, the steps of applying the coating 304 and curing the coating 306 may be performed at a temperature lower than 160 degrees Celsius. In still further embodiments, applying the coating 304 may include applying the coating in one or more layers, which may promote prevention of cracking of the coating during curing.

Figure 5:
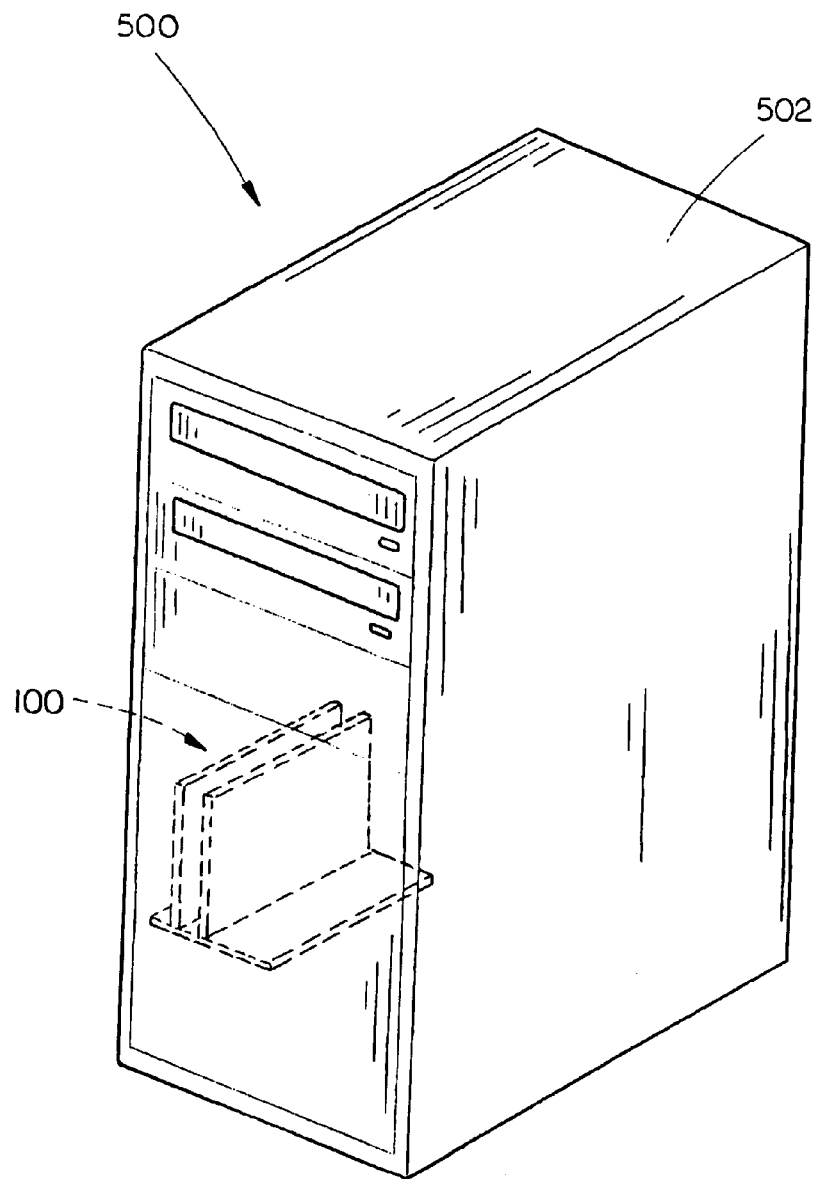
FIG. 5 is an isometric view of an electronic device including an integrated circuit assembly in accordance with an exemplary embodiment of the present invention.
Figure 6:
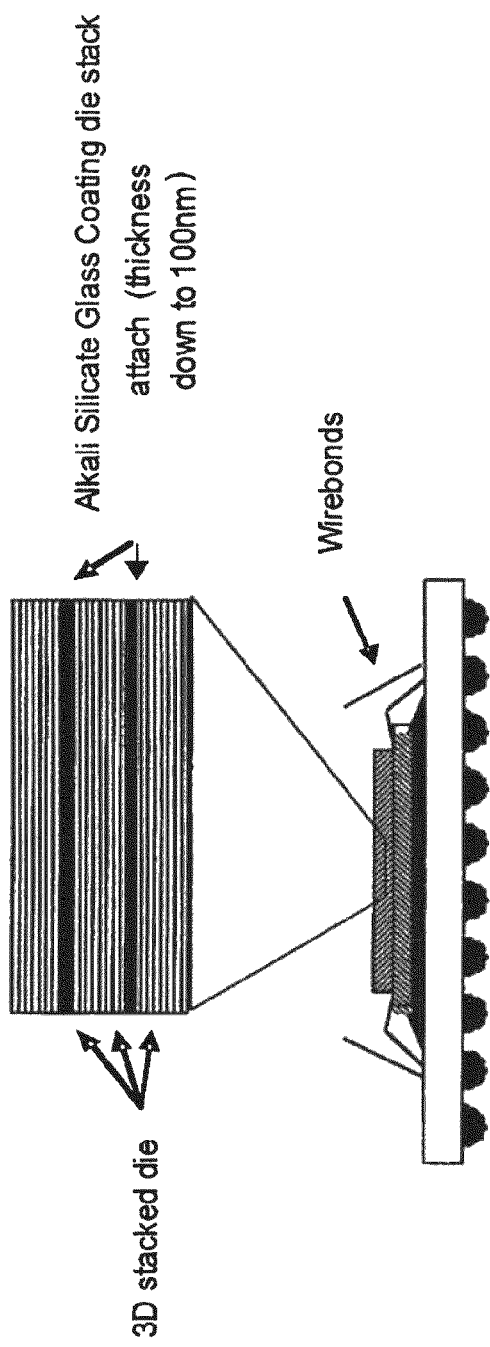
FIG. 6 is a view of a localized interconnect interface configured for connecting an integrated circuit to a second integrated circuit.

In further embodiments, the method 300 further includes at least substantially enclosing the integrated circuit assembly within a housing 308. For example, as shown in FIG. 5, the electronic device 500 may be a computer and the housing 502 may be a computer tower. In embodiments where the substrate is, for instance, a chip carrier, the step of enclosing the integrated circuit assembly within the housing 308, may include mounting the integrated circuit assembly (ex—integrated circuit and chip carrier) to a printed circuit board, then at least substantially enclosing the integrated circuit assembly and printed circuit board within the housing. For example, the printed circuit board may be a motherboard, an expansion board, a card, a daughtercard, a controller board, a network interface card (NIC), a video adapter, or the like.

In present embodiments, the method 300 further includes, prior to applying the coating, adding nanoparticles/nanosized particles (ex—particles having at least one dimension less than 100 nm) to the coating for promoting corrosion resistance of the assembly 310 and/or the coating itself. For example, nano-sized particles of calcium carbonate, zinc oxide, and/or the like may be added to the coating for promoting corrosion resistance of the integrated circuit assembly.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An integrated circuit assembly, comprising:
a substrate; and
an integrated circuit configured for being mounted to the substrate and comprising a localized interconnect interface, the interface being configured for connecting the integrated circuit to at least one of the substrate and a second integrated circuit of the assembly,
wherein the integrated circuit and the localized interconnect interface are at least partially coated with an alkali silicate glass coating for promoting reliability of the integrated circuit assembly in at least one of high temperature operating environments and corrosive operating environments; and
wherein the alkali silicate glass-based coating is produced from alkali metal oxide and silicon dioxide.

2. An integrated circuit assembly as claimed in claim 1, wherein the substrate is a chip carrier.

3. An integrated circuit assembly as claimed in claim 1, wherein the localized interconnect interface is a bond wire-bond pad interface, the bond wire-bond pad interface including at least one of a bond wire and a bond pad.

4. An integrated circuit assembly as claimed in claim 1, wherein the integrated circuit is a Commercial off the Shelf (COTS) device.

5. An integrated circuit assembly as claimed in claim 1, wherein the substrate is a printed circuit board.

6. An integrated circuit assembly, comprising:
a substrate;
an integrated circuit coupled to the substrate;
an interconnect interface configured to couple the integrated circuit to at least one of the substrate and a second integrated circuit of the assembly,
wherein the integrated circuit and the interconnect interface are at least partially coated with a low processing temperature, at least near-hermetic, glass-based coating for promoting reliability of the integrated circuit assembly in at least one of high temperature operating environments and corrosive operating environments, wherein the glass-based coating is an alkali silicate glass-based coating; and
wherein the alkali silicate glass-based coating is produced from alkali metal oxide and silicon dioxide.

7. The integrated circuit assembly of claim 6, wherein the substrate is a chip carrier or printed circuit board.

8. The integrated circuit assembly of claim 7, wherein the integrated circuit comprises a chip.

9. The integrated circuit assembly of claim 8, wherein the interconnect interface comprises a bond wire-bond pad interface.

10. The integrated circuit assembly of claim 9, wherein the integrated circuit is a flip-chip bonded integrated circuit.

11. The integrated circuit assembly of claim 8, wherein the interconnect interface is configured to couple the integrated circuit to the second integrated circuit of the assembly.

12. The integrated circuit assembly of claim 8, wherein the alkali silicate glass-based coating is formulated for being applied and cured at a temperature less than or equal to 160 degrees Celsius.

13. The integrated circuit assembly of claim 12, wherein the alkali silicate glass-based coating comprises a plurality of layers.

14. The integrated circuit assembly of claim 13, wherein the alkali silicate glass-based coating comprises nanoparticles selected from the group consisting of calcium carbonate, zinc oxide, divalent metal cations and rare earth oxides.

15. An electronic device, comprising:
an integrated circuit assembly; and
a housing substantially enclosing the integrated circuit assembly, wherein the integrated circuit assembly comprises:
a substrate;
an integrated circuit coupled to the substrate;
an interconnect interface configured to couple the integrated circuit to at least one of the substrate and a second integrated circuit of the assembly,
wherein the integrated circuit and the interconnect interface are at least partially coated with a low processing temperature, at least near-hermetic, glass-based coating for promoting reliability of the integrated circuit assembly in at least one of high temperature operating environments and corrosive operating environments, wherein the glass-based coating is an alkali silicate glass-based coating; and
wherein the alkali silicate glass-based coating is produced from $M_2O$ and $SiO_2$, wherein M is an alkali metal.

16. The electronic device of claim 15, wherein the electronic device is a cellular phone.

17. The electronic device of claim 15, wherein the substrate comprises a printed circuit board, wherein the printed circuit board is selected from the group consisting of a network interface card, a video adapter, and a motherboard.

18. The electronic device of claim 15, wherein the housing is a computer tower.

* * * * *